US011613222B2

United States Patent
Colarossi et al.

(10) Patent No.: US 11,613,222 B2
(45) Date of Patent: Mar. 28, 2023

(54) METHOD AND SYSTEM FOR SAFE DIAGNOSIS OF SQUIB LOOP COMPONENTS USING TRANSIENT RESPONSE CHARACTERISTICS FOR RESTRAINT CONTROL MODULE

(71) Applicant: Autoliv ASP, Inc., Ogden, UT (US)

(72) Inventors: Vincent Colarossi, Dearborn Heights, MI (US); Myron Senyk, Rochester Hills, MI (US)

(73) Assignee: VEONEER US, LLC, Southfield, MI (US)

( * ) Notice: Subject to any disclaimer, the term of this patent is extended or adjusted under 35 U.S.C. 154(b) by 0 days.

(21) Appl. No.: 15/940,585

(22) Filed: Mar. 29, 2018

(65) Prior Publication Data
US 2019/0302162 A1   Oct. 3, 2019

(51) Int. Cl.
| | | |
|---|---|---|
| *G01R 31/00* | (2006.01) | |
| *G01R 19/04* | (2006.01) | |
| *B60R 21/017* | (2006.01) | |
| *G01R 31/52* | (2020.01) | |
| *G01R 31/50* | (2020.01) | |

(52) U.S. Cl.
CPC ........ *B60R 21/0173* (2013.01); *G01R 19/04* (2013.01); *G01R 31/006* (2013.01); *G01R 31/52* (2020.01); *G01R 31/50* (2020.01)

(58) Field of Classification Search
CPC .... G01R 31/025; G01R 31/006; G01R 19/04; B60R 21/0173
See application file for complete search history.

(56) References Cited

U.S. PATENT DOCUMENTS

| | | | | |
|---|---|---|---|---|
| 5,440,990 A | * | 8/1995 | Wiedefeld | F41A 19/58 102/215 |
| 5,668,528 A | * | 9/1997 | Kitao | B60R 21/017 340/436 |
| 5,861,681 A | * | 1/1999 | Nakano | B60R 21/017 180/271 |
| 5,872,460 A | * | 2/1999 | Bennett | B60R 21/0173 280/735 |
| 6,084,439 A | * | 7/2000 | Sculley | H03K 5/1532 327/59 |
| 6,232,802 B1 | * | 5/2001 | Chang | G01R 19/04 327/58 |
| 2006/0097780 A1 | | 5/2006 | Grinnin et al. | |

(Continued)

FOREIGN PATENT DOCUMENTS

DE        3905422 A1 * 10/1989 ........... G01R 31/006

*Primary Examiner* — Alvaro E Fortich
*Assistant Examiner* — Adam S Clarke
(74) *Attorney, Agent, or Firm* — Dickinson Wright PLLC

(57) ABSTRACT

A method and system for diagnosing a squib loop in a restraint control module using a transient response is disclosed in the present application. The system may be used with a low energy actuator (LEA) which is primarily an inductive device. A diagnostic current may be applied to the squib loop for a diagnostic test period and the voltage between the feed line terminal and the return line terminal or the voltage between the return line terminal and the feed line terminal can be monitored at a specific time or times during the test period for the expected response (e.g. peak voltage, rise rate, etc). The current may also be reversed to check the correct polarity of a diode in the LEA.

16 Claims, 7 Drawing Sheets

(56) References Cited

U.S. PATENT DOCUMENTS

| | | | |
|---|---|---|---|
| 2008/0086250 A1 | 4/2008 | Kuivenhoven | |
| 2008/0278174 A1 | 11/2008 | Li et al. | |
| 2013/0169265 A1* | 7/2013 | Tamura | G01R 19/04 324/76.77 |
| 2015/0014972 A1* | 1/2015 | Schumacher | B60R 21/017 280/735 |
| 2015/0022923 A1* | 1/2015 | Chevrier | G01F 1/667 361/57 |
| 2015/0293164 A1* | 10/2015 | Stephenson | G01R 31/025 324/509 |
| 2018/0017601 A1* | 1/2018 | Easwaran | G01R 31/2829 |
| 2019/0047502 A1* | 2/2019 | Lamesch | B60N 2/002 |

* cited by examiner

METHOD AND SYSTEM FOR SAFE DIAGNOSIS OF SQUIB LOOP COMPONENTS USING TRANSIENT RESPONSE CHARACTERISTICS FOR RESTRAINT CONTROL MODULE

BACKGROUND

The present application relates generally to a method and system for diagnosing squib loop components using transient response characteristics.

An airbag system typically includes a restraint control module, a reaction canister, an air bag, and an inflator with ignitor (squib) that are stored inside the reaction canister. The inflator with squib is connected to the restraint control module via conductive wires and connectors. The total electrical path of these wires and connectors to and from the inflator is termed "squib loop". The restraint control module provides sufficient energy to the inflator through the squib loop to provide airbag actuation. The inflator is actuated by the restraint control module once appropriate signals received from vehicle sensors are sufficient to warrant airbag activation. The restraint control module controls the overall operation of the air bag system and can be viewed as the main control unit for the air bag system.

As with any electrical system that consists of sensors, airbag, wiring and connectors etc, the system requires electrical connections to operate property. Specifically, in airbag safety systems customers demand that diagnostic capability be implemented in the restraint control module to interrogate the squib loop characteristics, that may prevent the air bag from being activated property. An example of one squib loop characteristic is the presence check of the LEA protection diode.

BRIEF SUMMARY

A method and system for diagnosing a squib loop in a restraint control module using a transient response is disclosed in the present application. The system may be used with a low energy actuator (LEA) which is primarily an inductive device. A diagnostic current may be applied to the squib loop for a period of time and the voltage between the feed line terminal and the return line terminal or the voltage between the return line terminal and the feed line terminal can be monitored at a specific time or times during the diagnostic period for the expected response (e.g. peak voltage, rise rate, etc). The current may also be reversed to check the correct polarity of a diode in the LEA.

Further objects, features and advantages of this application will become readily apparent to persons skilled in the art after a review of the following description, with reference to the drawings and claims that are appended to and form a part of this specification.

BRIEF DESCRIPTION OF THE DRAWINGS

In the accompanying drawings the components are not necessarily to scale, emphasis instead being placed upon illustrating the principles of the application. Moreover, like reference numerals designate corresponding parts throughout the views.

DETAILED DESCRIPTION

Airbag safety restraint systems typically employ a single inflator device to produce inflation gas for inflating a vehicle occupant restraint airbag the event of a collision. The inflator device is controlled by a squib driver circuit. The squib driver circuit may include a high side driver and as low side driver implemented on a single deployment chip.

Various manufacturers require the ability to drive and diagnose what is known as Low Energy Actuator (LEA) Loads. The LEA load is highly inductive (3 mH typically) and contains an additional flyback clamping diode to absorb the stored energy in the LEA, post LEA activation to prevent deployment squib driver destruction. The diode protects the system from excess energy when properly working and is connected electrically in the correct polarity. The diode can also prevent deployment when improperly working or is connected electrically in the incorrect polarity.

One issue is that it can be difficult or impossible to properly detect the presence and or the correct polarity of the diode with typical DC diagnostic currents available during squib diagnostics. The newly proposed method and system for safe diagnosis of squib loop components using transient response characteristics in a restraint control module can provide diagnostic coverage for the LEA protection diode component. The concept may use certain squib resistance diagnostic resources (I_SRM and pulldown current source) with additional control of the slew rate (di/dt) of the current and additional multiplexer switches for bilateral current injection and voltage measurement, and the LEA inductance (3 mH typically). The concept of the DC biasing and pulsed amplitude is given is also provided. This new proposal will provide safe diagnostic presence detection of the LEA protection diode and LEA inductance. Safe may be interpreted to include that the diagnostics fulfill the ignitor No-Fire Limits for both DC and transient limits.

Figure 1:
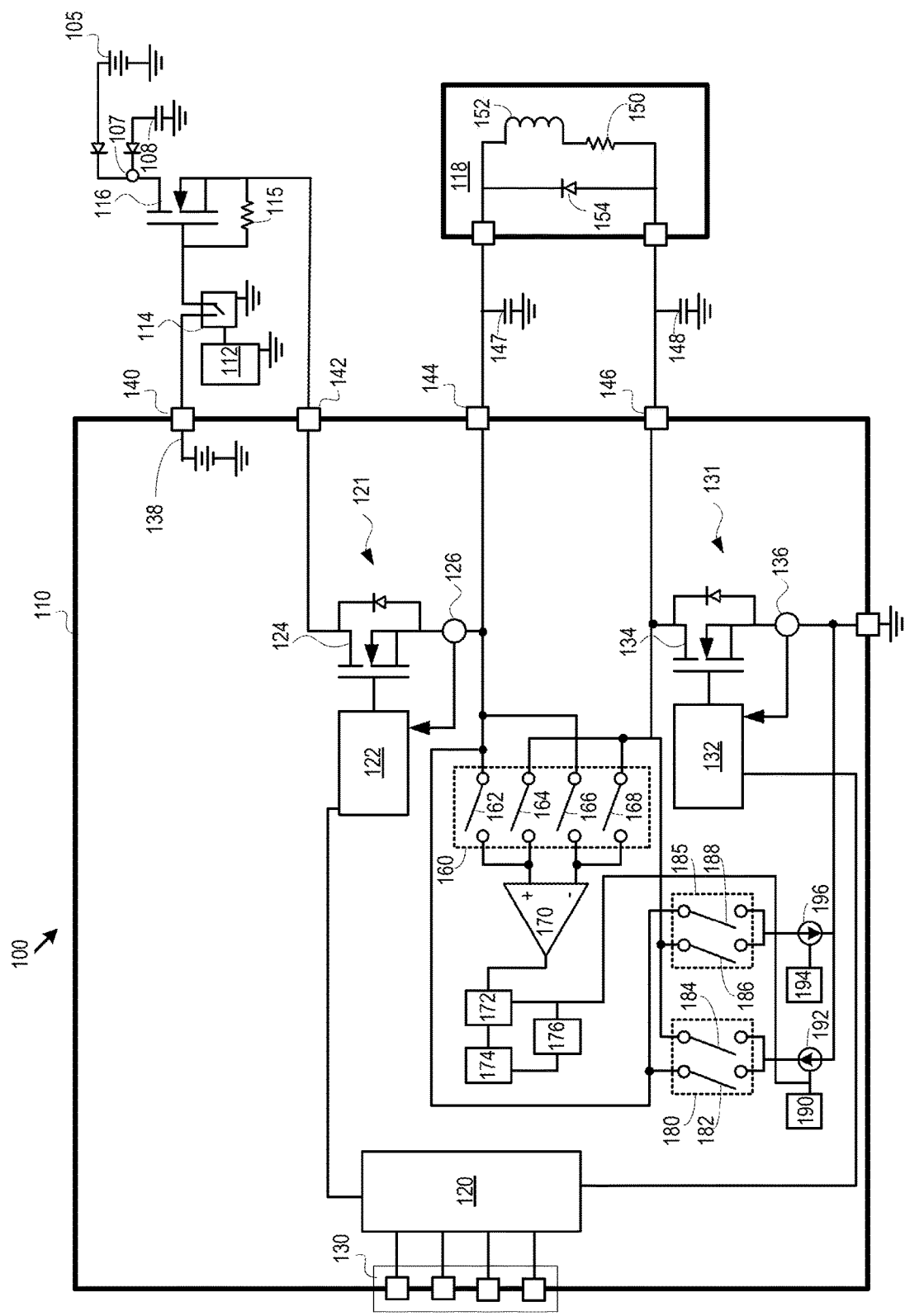
FIG. 1 is a schematic view of one implementation of a squib driver circuit for diagnosing components using transient response.

FIG. 1 is a schematic illustration of a squib driver circuit 100. The squib driver circuit includes a deployment chip 110. The deployment chip 110 may be a single silicon chip, for example, an ASIC (Application Specific Integrated Circuit). The deployment chip 110 may include an input terminal ($SS_{xy}$) 142 for receiving an input voltage. The input voltage may be used to fire a deployable restraint such as an air bag. The input terminal ($SS_{xy}$) 142 may receive the input voltage from a battery such as vehicle battery 105. A switch 116 such as the power transistor may be located between the input terminal ($SS_{xy}$) 142 and the battery 105. The battery 105 may be connected to the switch 116 through a diode, further the switch may be connected to an electrical ground though a diode and capacitor ($C_{ER}$) 108.

The switch 116 may control power provided to the input terminal 142 from the battery 105 as directed by an enable switch 114. The enable switch 114 may receive enable voltage 138 from an output terminal (VSF) 140 of the deployment chip 110. The output voltage may be provided from the output terminal 140 (VSF) to the enable switch 114. The microprocessor control circuit 112 may control the enable switch 114. When the enable switch 114 is active, the enable voltage may be provided to activate switch 116 allowing the battery 105 to provide power to the input terminal ($SS_{xy}$) 142. In some implementations, the enable switch 114 may be connected to the gate of a power transistor thereby acting as a switch or regulator allowing the battery 105 to provide power to the input terminal ($SS_{xy}$) 142. In some implementations, the switch 116 may be an N-channel MOSFET with a drain in connection with the battery 105 and a source in connection with the input terminal ($SS_{xy}$) 142. Resistor 115 may be connected between the source and the gate of switch 116. In this implementation, a resistor may be placed between the gate and source to allow proper operation. The switch 116 can be a MOSFET that provides two functions: Firstly, switch 116 can provide a redundant silicon control path that can prevent deployment in case of system failure where, for example Switch 116 is disabled and switches 124 and 134 of deployment chip 110 become active due to a common failure mode. Secondly, switch 116 can provide a reduced and more controlled V($SS_{xy}$,0) 142 when implemented as a pass element part of a closed loop regulator control path and hence absorb more power and provide a lower level of power dissipation on the expensive ASIC squib driver transistors to minimize system cost.

The input terminal ($SS_{xy}$) 142 may be connected to a high side driver circuit 121. The high side driver circuit 121 may be connected between the input terminal 142 and the high side feed terminal 144. In one implementation, a power transistor 124 may be connected between the input terminal ($SS_{xy}$) 142 and the high side feed terminal ($SF_x$) 144. The power transistor 124 may be an N-channel MOSFET with a drain connected to the input terminal ($SS_{xy}$) 142 and a source connected to the high side feed terminal ($SF_x$) 144. A gate of the power transistor 124 may be connected to a high side gate driver circuit 122. In some implementations, a current sensor 126 may provide a current signal to the high side gate driver circuit 122. The gate driver circuit 122 may utilize the current signal to control activation of the power transistor 124 in response to the amount of current flow. The current sensor 126 may be located between the power transistor 124 and the high side feed terminal ($SF_x$) 144. The high side feed terminal ($SF_x$) 144 may be connected to an ignitor (R_ignitor) 118 through a feed wire. The current may be returned from the ignitor 118 through a return wire to a low side return terminal ($SR_x$) 146. The feed wire may be tied to ground though a capacitor 147 and the return wire may be tied to ground through a capacitor 148.

The ignitor 118 may be a low energy actuator and may include resistive components 150 and inductive components 152. Further, the ignitor 118 may include current blocking components such as diode 154. The diode may be oriented with an anode connected to the return line and a cathode connected to the feed line. The inductive nature of the ignitor, particularly an LEA ignitor, means that the response to a test current or voltage applied to either the high side feed terminal ($SF_x$) 144 or the low side return terminal ($SR_x$) 146 will change over time and can be used over time to analyze the operability of the ignitor.

A low side driver circuit 131 may be connected between the low side return terminal ($SR_x$) 146 and an electrical ground. In one implementation, a power transistor 134 may be connected between the return terminal ($SR_x$) 146 and the electrical ground. The power transistor 134 may be an N-channel MOSFET with a drain connected to the return terminal ($SR_x$) 146 and a source connected to the electrical ground. A gate of the power transistor 134 may be connected to a low side gate driver circuit 132. In some implementations, a current sensor 136 may provide a current signal to the low side gate driver circuit 132. The gate driver circuit 132 may utilize the current signal to control activation of the power transistor 134 in response to the amount of current flow. The current sensor 136 may be located between the power transistor 134 and the electrical ground.

A digital control circuit 120 may receive commands from a communication interface 130, such as a serial communication interface. The commands provided to the digital circuit 120 through the communication interface 130 may include an enable command, an all fire command, as well as various configuration commands to set timer durations or thresholds for various components such as the high side gate driver 122 or the low side gate driver 132.

The deployment chip 110 may include a test circuit and switch unit 160. The test circuit may include an amplifier 170 with either input being connectable to either the high side feed terminal ($SF_x$) 144 or the low side return terminal ($SR_x$) 146 through the switch unit 160.

The switch unit 160 may include a first switch 162 configured to connect or isolate the test circuit (e.g. the first input of the amplifier 170) from the high side feed terminal ($SF_x$) 144. The switch unit 160 may include a second switch 164 configured to connect or isolate the test circuit (e.g. the first input of the amplifier 170) from a low side return terminal ($SR_x$) 146. The switch unit 160 may include a third switch 166 configured to connect or isolate the test circuit (e.g. the second input of the amplifier 170) from the high side feed terminal ($SF_x$) 144. The switch unit 160 may include a fourth switch 168 configured to connect or isolate the test circuit (e.g. the second input of the amplifier 170) from a low side return terminal ($SR_x$) 146.

The amplifier 170 may have an output connected to a peak detector 172. The peak detector 172 may be connected to an analog to digital converter (ADC) 172 to capture the peak voltage from the output of the amplifier 170. The output control of the peak detector 172 and/or the ADC 174 may be provided by a delay circuit 176. The output of the delay circuit 176 and/or the peak detector 172 may be provided by current controller 190 and/or current controller 194. The current controller 190 may be connected to and control the current source 192. The current source 192 is connectable to either the high side feed terminal ($SF_x$) 144 or the low side return terminal ($SR_x$) 146 through the switch unit 180.

The switch unit 180 may include a first switch 182 configured to connect or isolate the current source 192 from the high side feed terminal ($SF_x$) 144. The switch unit 180 may include a second switch 184 configured to connect or isolate the current source 192 from a low side return terminal ($SR_x$) 146.

The current controller 194 may be connected to and control the current source 196. The current source 196 is connectable to either the high side feed terminal ($SF_x$) 144 or the low side return terminal ($SR_x$) 146 through the switch unit 185.

The switch unit 185 may include a first switch 186 configured to connect or isolate the current source 196 from the high side feed terminal (SF$_x$) 144. The switch unit 185 may include a second switch 188 configured to connect or isolate the current source 196 from a low side return terminal (SR$_x$) 146. Current source 196 and current source 192 may be configured to provide current in opposite directions from one another. For example, current source 192 may be configured to source current from ground and current source 196 may be configured to sink current to ground.

Figure 2:
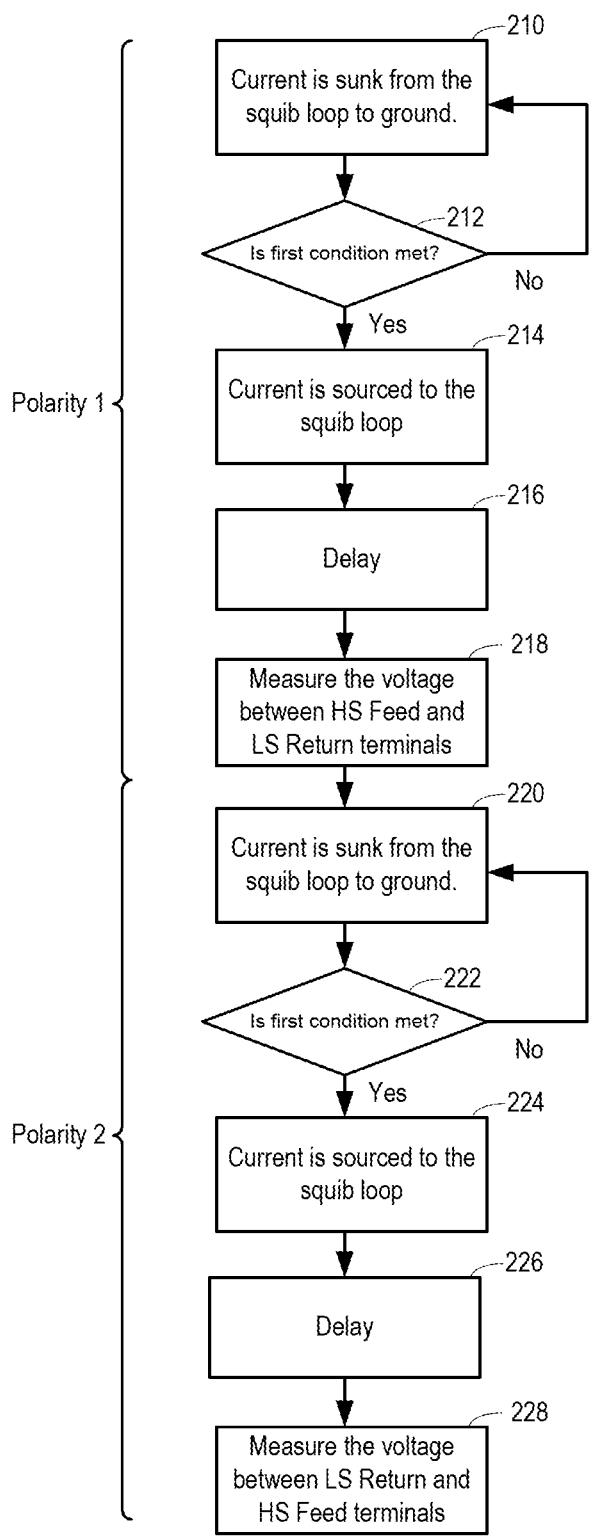
FIG. 2 is a flow chart illustrating a method for diagnosing components of a squib loop using transient response.

FIG. 2 is a flowchart illustrating a method of diagnosis using transient response. The method starts in block 210, where current is pulled from the squib loop (e.g. the low side return terminal) to ground. This should discharge the capacitors 147 and 148 through the LEA. In block 212, the system checks if a first condition is met (e.g. a time period has expired or if the voltage across the high side feed terminal and the low side return terminal hits a threshold voltage). After the first condition is met, current is provided to the squib loop (e.g. to the high side feed terminal), in block 214, while the current pulled from the squib loop is still active. The system determines if a second condition (e.g. a delay period has expired from the current being provided to the squib loop, or voltage threshold) is met, in block 216. After the second condition is met, the voltage is measured (e.g. by the amplifier 170, the peak detector 172, and the ADC 174) between the high side feed terminal and the low side return terminal in block 218. If the measured voltage is outside an expected range threshold (e.g. upper and/or lower threshold) an alarm may be triggered.

Then the process is repeated in the opposite polarity. Current is pulled from the squib loop (e.g. the high side feed terminal) to ground, in block 220. This should discharge the capacitors 147 and 148 through the LEA. In block 222, the system checks if a first condition is met (e.g. a time period has expired or if the voltage across the high side feed terminal and the low side return terminal hits a threshold voltage). After the first condition is met, current is provided to the squib loop (e.g. to the low side return terminal), in block 224, while the current pulled from the squib loop is still active. The system determines if a second condition (e.g. a delay period has expired from the current being provided to the squib loop, or voltage threshold) is met, in block 226. After the second condition is met, the voltage is measured (e.g. by the amplifier 170, the peak detector 172, and the ADC 174) between the high side feed terminal and the low side return terminal in block 228. If the measured voltage is outside an expected range threshold (e.g. upper and/or lower threshold) an alarm may be triggered. The voltage may also be measured multiple times or iteratively to determine the voltage slope over time.

Figure 3:
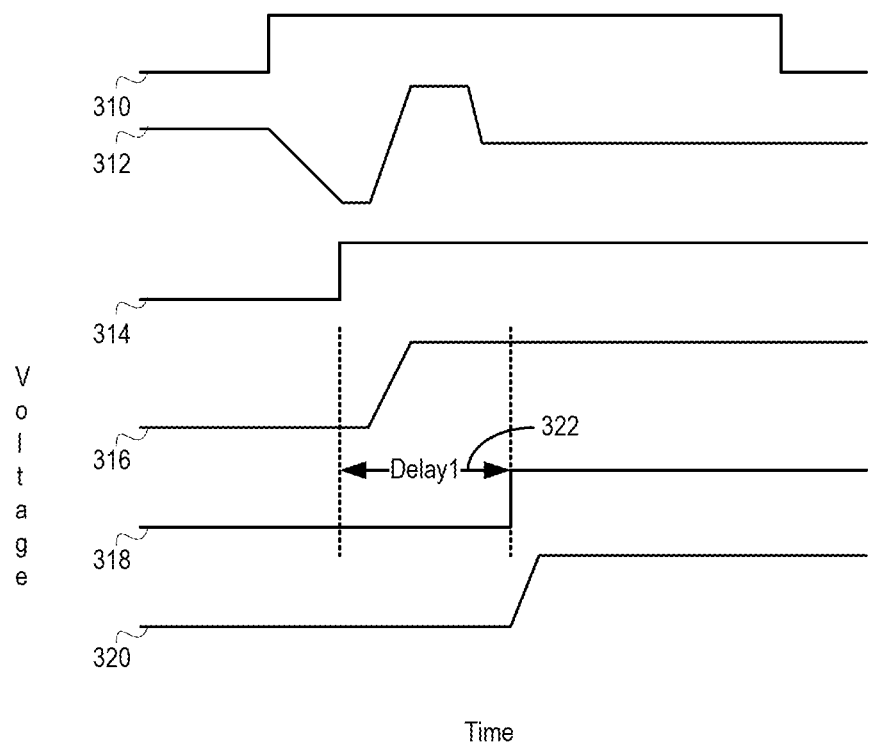
FIG. 3 is a timing diagram of the test response.

FIG. 3 is a timing diagram of the diagnostic response. For example, line 310 represents the voltage of the first current supply control signal. The current supply starts in the off state, then turns on during the start test phase and turns off at the end of the diagnostic phase. The first current supply may be configured to sink current to ground from the squib loop. Line 312 represents the voltage at the high side feed terminal or low side return terminal (whichever is being tested at the time). Line 314 represents the second current supply control signal. Line 316 represents the voltage at the peak detector. Line 318 represents the voltage trigger signal for analog to digital converter that measures the output of the peak detector after the delay (Delay1) 322. The delay may be triggered by the start of the second current supply control signal. The second current supply may be configured to provide current to the squib loop from ground. Line 320 represents the analog to digital measurement of the peak detector output.

Figure 4:
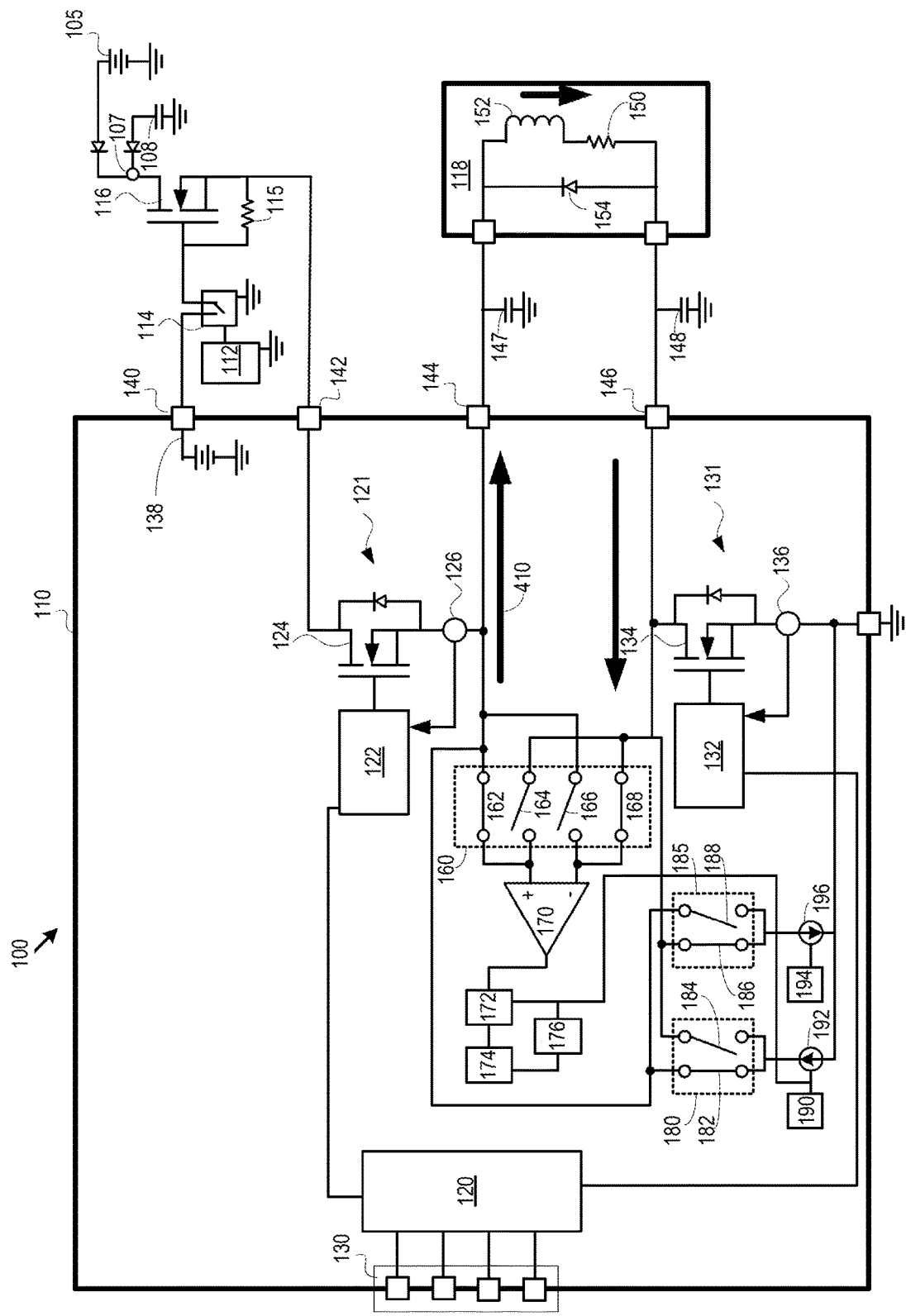
FIG. 4 is a schematic view of a squib driver circuit for diagnosing components using transient response while performing a first portion of a test on a properly installed component.

FIG. 4 a schematic view of a squib driver circuit for diagnosing components using transient response while performing a first portion of a diagnostic test. During the first portion of the diagnostic test the squib driver circuit sources current 410 to the high side feed terminal (SF$_x$) 144 and returns current 410 to the low side return terminal (SRx) 146 (e.g. steps 210-218). Switches 162, 168, 182, and 186 may be closed and switches 164, 166, 184, and 188 may be open. In this scenario, the diode blocks current to flow through the diode and the voltage will expand beyond a typical diode forward voltage drop. Therefore, the expected measured voltage from the peak detector value would exceed the diode voltage drop and the system would compare the sampled voltage to the peak voltage acquired after the delay will be around a target value between an upper threshold value and lower threshold value. The target value is a function of the inductive components, capacitive components, resistive components and di/dt of the applied current for the given time delay. As such, the sampled voltage being within the upper and lower threshold values is indicative of the diode polarity being correct, the current through the LEA being correct, and the di/dt through the LEA being correct. If not, an alarm message may be generated.

Figure 5:
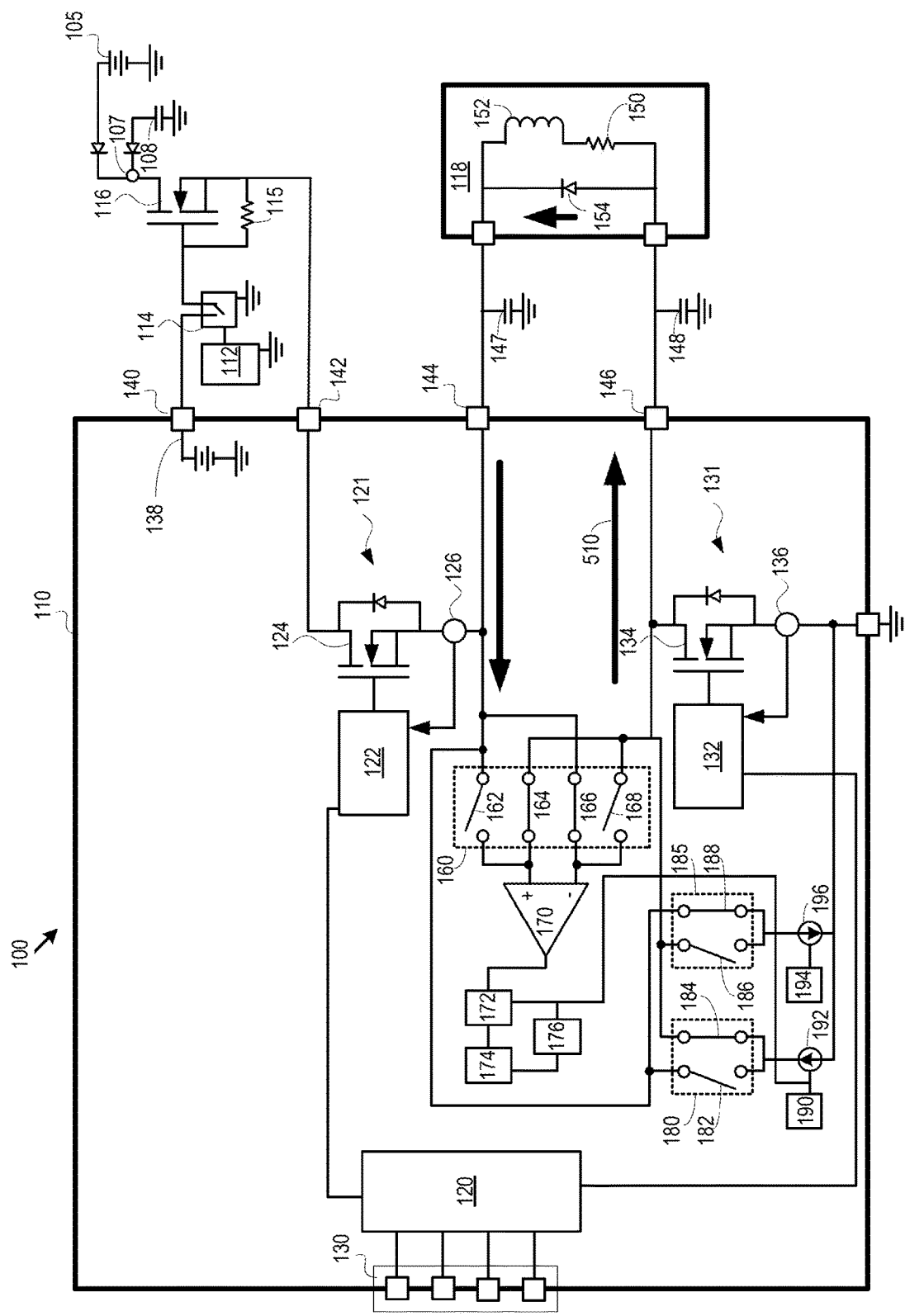
FIG. 5 is a schematic view of a squib driver circuit for diagnosing components using transient response while performing a second portion of a test on a properly installed component.

FIG. 5 a schematic view of a squib driver circuit for diagnosing components using transient response while performing a second portion of a diagnostic test. During the second portion of the diagnostic test, the squib driver circuit sources current 510 to the low side return terminal (SR$_x$) 146 and returns current 510 to the high side feed terminal (SFx) 144 (e.g. steps 220-228). Switches 164, 166, 184, and 188 may be closed and switches 162, 168, 182, and 186 may be open. In this scenario, the diode allows current to flow through the diode with only the diode voltage drop. Therefore, the expected measured voltage from the peak detector value would be the diode voltage drop and the system would compare the sampled voltage to an upper threshold and a lower threshold positioned around the diode voltage drop. If the sampled value is within the threshold range it is indicative that the diode polarity of the installation is correct. If not, an alarm message may be generated.

Figure 6:
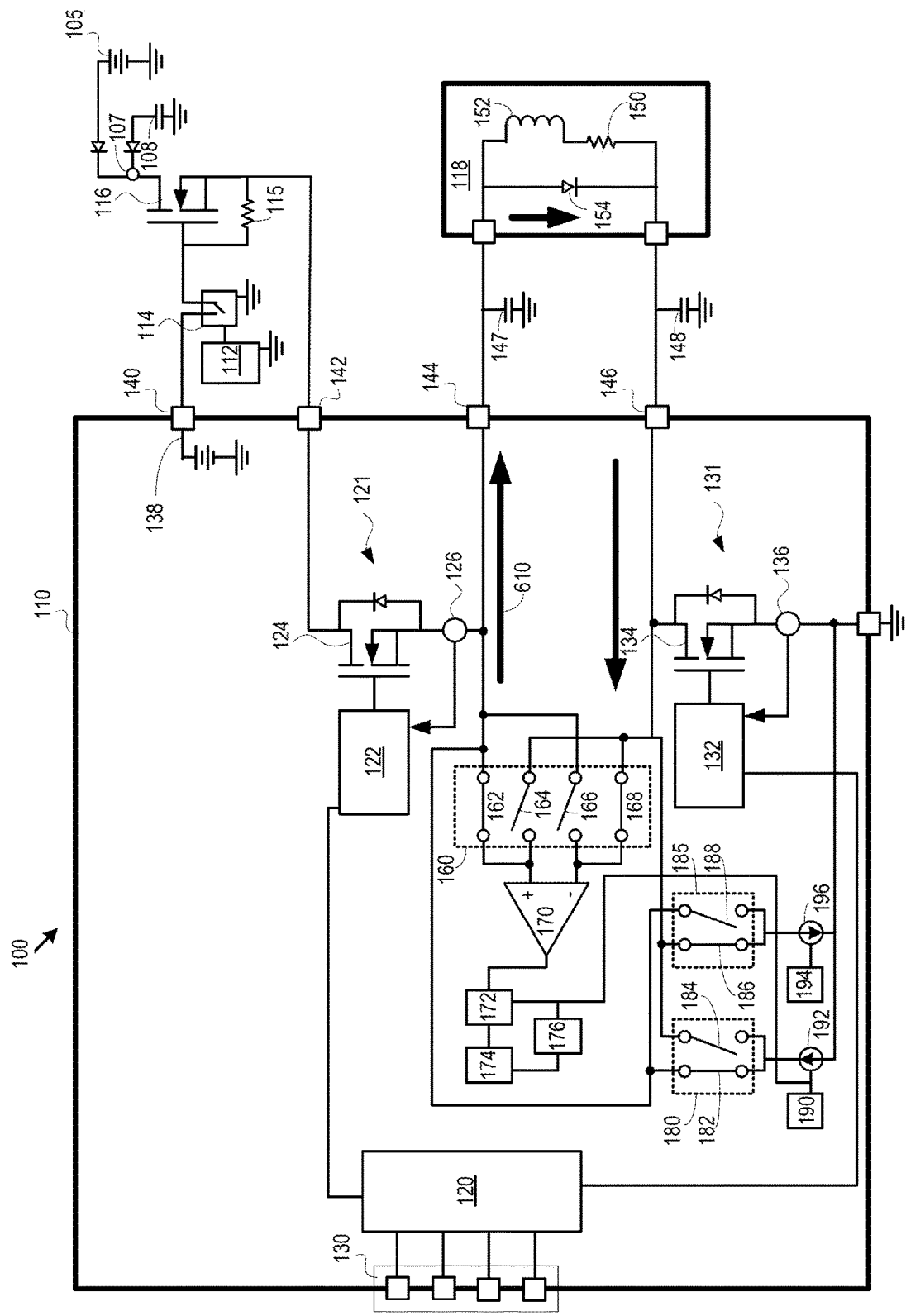
FIG. 6 is a schematic view of a squib driver circuit for diagnosing components using transient response while performing a first portion of a test on an improperly installed component.

FIG. 6 a schematic view of a squib driver circuit for diagnosing components using transient response while performing a first portion of a diagnostic test on an improperly installed diode component 154 (polarity flipped). During the first portion of the diagnostic test, the squib driver circuit provides current 610 to the high side feed terminal (SR$_x$) 144 (e.g. steps 210-218) on an improperly installed diode 154. Switches 162, 168, 182, and 186 may be closed and switches 164, 166, 184, and 188 may be open. In this scenario, the diode 154 is not installed correctly, therefore, the peak voltage acquired after the delay will not be between an upper threshold value and lower threshold value in a range expected to be much larger than a diode voltage drop. Rather the current will flow through the diode with only a diode voltage drop. An alarm message may be generated.

Figure 7:
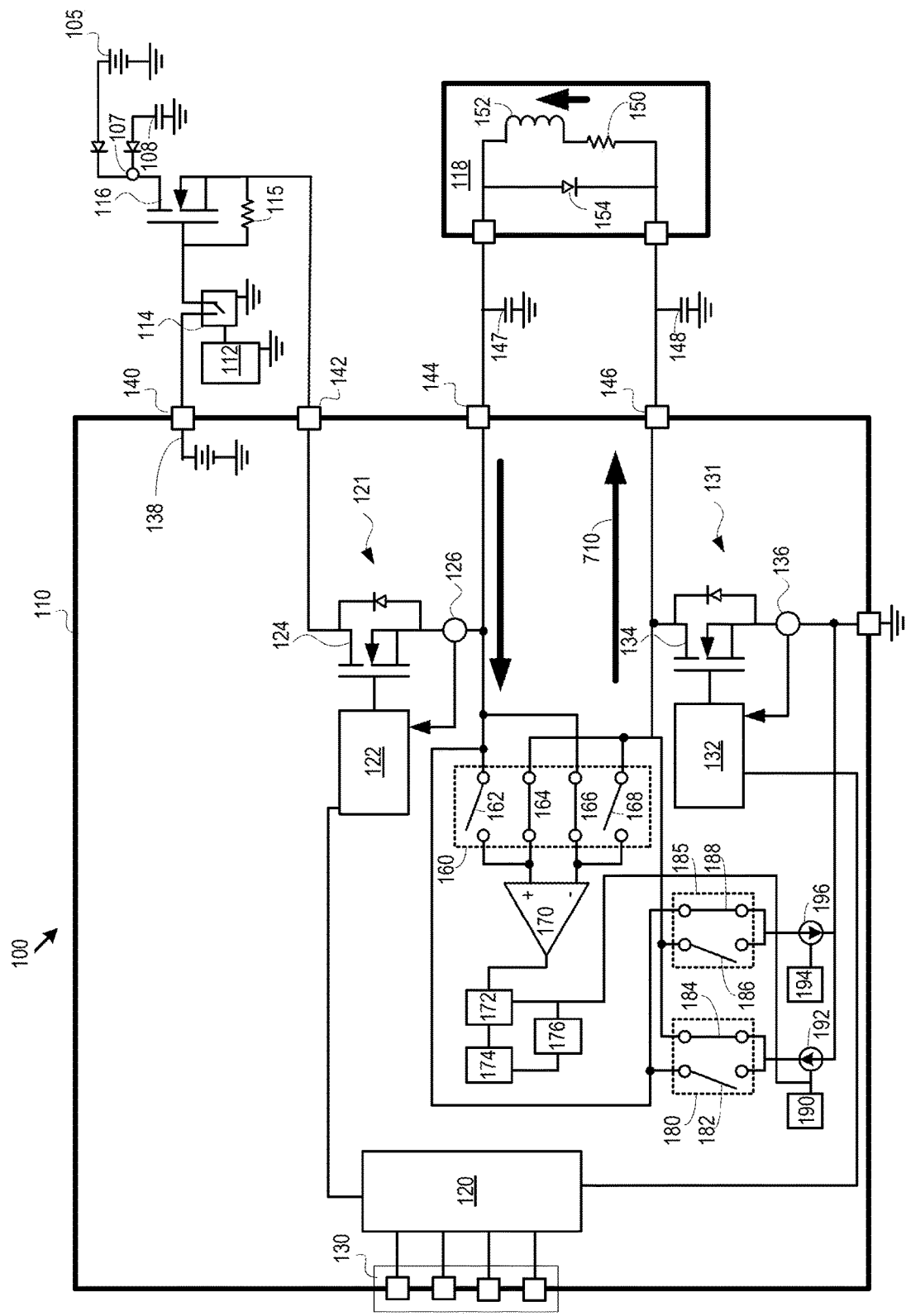
FIG. 7 is a schematic view of a squib driver circuit for diagnosing components using transient response while performing a second portion of a test on an improperly installed component.

FIG. 7 a schematic view of a squib driver circuit for diagnosing components using transient response while performing a second portion of a diagnostic test on an improperly installed diode component 154 (polarity flipped). During the second portion of the diagnostic test, the squib driver circuit sources current 710 to the low side return terminal (SR$_x$) 146 and returns current 710 to the high side feed terminal (SFx) 144 (e.g. steps 220-228) on an improperly installed diode component 154. In this scenario, the diode 154 is not installed correctly, therefore, the peak voltage acquired after the delay will not be between an upper threshold value and lower threshold value in a range expected to be a diode voltage drop. Rather the current is blocked by the diode resulting in a much larger voltage drop which it is indicative that the diode polarity of the installation is correct. An alarm message may be generated.

The methods, devices, processing, and logic described above may be implemented in many different ways and in many different combinations of hardware and software. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples.

The circuitry may further include or access instructions for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed as circuitry among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many different ways, including as data structures such as linked lists, hash tables, arrays, records, objects, or implicit storage mechanisms. Programs may be parts (e.g., subroutines) of a single program, separate programs, distributed across several memories and processors, or implemented in many different ways, such as in a library, such as a shared library (e.g., a Dynamic Link Library (DLL)). The DLL, for example, may store instructions that perform any of the processing described above or illustrated in the drawings, when executed by the circuitry.

As a person skilled in the art will readily appreciate, the above description is meant as an illustration of the principles of this disclosure. This description is not intended to limit the scope or application of this disclosure in that the systems and methods are susceptible to modification, variation and change, without departing from spirit of this disclosure, as defined in the following claims.

The invention claimed is:

1. A system for safe diagnosis of a squib loop, the system comprising:

a high side driver connected to a firing voltage source and a feed terminal for the squib loop;
a low side driver connected to a return terminal for the squib loop and a ground;
a testing current source being configured to provide a test current to the feed terminal for a defined time period, the test current satisfying an igniter No-Fire limit;
a voltage measurement unit configured to measure a voltage between the feed terminal and the return terminal during the defined time period and determine a peak voltage; and
a switch configured to connect the testing current source to one of the return terminal or the feed terminal;
wherein the system is configured to detect a polarity of a current blocking diode connected between the feed terminal and the return terminal, and
wherein the measurement unit is configured to determine if the peak voltage is in a first threshold range when sourcing current in a first direction and determine if the peak voltage is in a second threshold range when sourcing current in a second direction opposite the first direction.

2. The system according to claim 1, wherein the feed terminal and the return terminal are connected to an actuator.

3. The system according to claim 2, wherein the actuator includes the current blocking diode in parallel with resistive and inductive elements of the actuator.

4. The system according to claim 3, wherein the current blocking diode has a design orientation with a cathode connected to the feed terminal and an anode connected to the return terminal.

5. The system according to claim 2, wherein the actuator is a low energy actuator.

6. The system according to claim 1, wherein the switch includes a first switch configured to connect the testing current source to the feed terminal.

7. The system according to claim 1, further comprising a second switch configured to connect a current sink to the return terminal.

8. The system according to claim 1 wherein the switch includes a third switch configured to connect the testing current source to the return terminal.

9. The system according to claim 1, further comprising a fourth switch configured to connect a current sink to the feed terminal.

10. The system according to claim 1, wherein the second threshold range includes a voltage drop of a diode in the squib loop.

11. The system according to claim 1, wherein the measurement unit is configured to determine a slope of the voltage over time.

12. The system according to claim 1, wherein the system is configured to detect the polarity of the current blocking diode by comparing the voltage between the feed terminal and the return terminal with an upper threshold of a diode voltage drop.

13. A method for diagnosing leakage in a squib loop, the method comprising the steps of:

connecting a testing current source to a feed terminal of the squib loop;
providing a testing current to the feed terminal;
connecting a measuring circuit between the feed terminal and a return terminal;
measuring a peak voltage between the feed terminal and the return terminal after waiting a delay time from the providing the testing current;

connecting the testing current source to the return terminal of the squib loop; providing a testing current to the return terminal;

connecting the measuring circuit between the return terminal and the feed terminal; and measuring a peak voltage between the return terminal and the feed terminal after waiting the delay time from the providing the testing current.

14. The method according to claim 13, further comprising:

before providing a testing current to the feed terminal, connecting a current sink to the return terminal.

15. The method according to claim 13, further comprising:

before providing a testing current to the return terminal, connecting a current sink to the return terminal.

16. A system for diagnosing leakage in a squib loop, the system comprising:

a high side driver connected to a firing voltage source and a feed terminal for the squib loop;

a low side driver connected to a return terminal for the squib loop and a ground;

a testing current source being configured to provide a test current to the feed terminal for a defined time period; and a voltage measurement circuit comprising a peak detector circuit, an analog to digital converter and a time delay circuit, the peak detector providing a peak voltage to the analog to digital converter to measure a voltage between the feed terminal and the return terminal after a time delay after the test current is provided to the feed terminal, the time delay determined by the time delay circuit;

a first switch configured to connect the testing current source to the feed terminal;

a second switch configured to connect a current sink to the return terminal; and a third switch configured to connect the testing current source to the return terminal and a fourth switch configured to connect the current sink to the feed terminal.

* * * * *